United States Patent
Yeung et al.

(10) Patent No.: US 6,784,102 B2
(45) Date of Patent: Aug. 31, 2004

(54) LATERALLY INTERCONNECTING STRUCTURES

(75) Inventors: Max M. Yeung, San Jose, CA (US); Tauman T. Lau, San Jose, CA (US); Anwar Ali, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 1 day.

(21) Appl. No.: 10/267,810

(22) Filed: Oct. 9, 2002

(65) Prior Publication Data

US 2004/0072421 A1 Apr. 15, 2004

(51) Int. Cl.[7] .............................................. H01L 21/44
(52) U.S. Cl. ....................... 438/667; 438/666; 438/640; 438/584
(58) Field of Search ................................ 438/584, 624, 438/638, 639, 640, 701, 666, 667; 257/786, 774, 775, 773

(56) References Cited

U.S. PATENT DOCUMENTS

| | | | |
|---|---|---|---|
| 6,204,554 B1 | 3/2001 | Ewer et al. ................. | 257/705 |
| 6,255,586 B1 * | 7/2001 | Kim et al. ................. | 174/52.1 |
| 6,367,152 B1 | 4/2002 | Kataoka ................. | 29/890.03 |
| 6,512,293 B1 * | 1/2003 | Chia et al. ................. | 257/730 |

* cited by examiner

*Primary Examiner*—Caridad Everhart
(74) *Attorney, Agent, or Firm*—Luedeka, Neely & Graham

(57) ABSTRACT

A method of increasing mechanical interlocking between a first structure and a second adjacent structure in an integrated circuit. The first structure is formed with a first surface having a first horizontal component, and the second structure is formed with a second surface having a second horizontal component. The first surface laterally engages the second surface and the first horizontal component is complementary to the second horizontal component, such that the first structure prohibits vertical movement of the second structure.

20 Claims, 4 Drawing Sheets

LATERALLY INTERCONNECTING STRUCTURES

FIELD

This invention relates to the field of integrated circuit processing. More particularly, this invention relates to structure designs that reduce inter structure separations.

BACKGROUND

Integrated circuits are typically formed of layers of different materials that are built up, one on top of the other. The different layers are all design to provide different functions within the finished integrated circuits. However, because any given layer tends to be formed of a different material than the layers to which it is immediately adjacent, either vertically or laterally, it is possible that when sufficient forces are applied to the layers, they may pull apart from each other to some degree. This, of course, tends to disrupt the proper operation of the integrated circuit.

For example, electrically conductive structures are often formed of metallic materials and alloys, among other materials. The electrically conductive structures are electrically isolated one from another by dielectrics, or electrically insulating layers, such as those formed of oxides, like silicon oxide. Electrically conductive structures called vias are used to conduct electrical signals from an overlying electrically conductive layer, through an intervening dielectric layer, to an underlying electrically conductive layer. However, if sufficient forces are imparted on the overlying electrically conductive layer, such as if upward forces are applied to it, the via may tear loose from the underlying electrically conductive layer.

As a further and more specific example, electrically conductive bonding disposed near the top surface of an integrated circuit are typically formed of a metal or a metal alloy. When an electrical connection is formed on the bonding pad, such as when a wire bond is made, there is typically a relatively strong vertical lifting force applied to the bonding pad when the bonding tool, such as a bonding tip or capillary, is pulled away from the bonding pad. This upward force can tear the bonding pad away from the adjacent layers, can rip the vias connected to the bonding pad out of the underlying layers, and cause a general disruption to many of the layers underlying and in near proximity to the bonding pad.

What is needed, therefore, is a system by which different layers within an integrated circuit are more resistant to forces that might otherwise pull them apart, one from another.

SUMMARY

The above and other needs are met by a method of increasing mechanical interlocking between a first structure and a second adjacent structure in an integrated circuit. The first structure is formed with a first surface having a first horizontal component, and the second structure is formed with a second surface having a second horizontal component. The first surface laterally engages the second surface and the first horizontal component is complementary to the second horizontal component, such that the first structure prohibits vertical movement of the second structure.

In this manner, the laterally interlocking horizontal components of the first and second structures provide a mechanical mechanism by which vertical forces that are applied to one of the structures are opposed with the other structure. Thus, the degree to which such vertical forces are able to separate the first and second structures is reduced.

In various preferred embodiments of the method, the first structure is an electrically conductive via and the second structure is an electrically nonconductive layer through which the via passes. Alternately, the second structure is an electrically conductive via and the first structure is an electrically nonconductive layer through which the via passes. In another embodiment, the first structure is an electrically conductive layer and the second structure is an electrically nonconductive layer, or the second structure is an electrically conductive layer and the first structure is an electrically nonconductive layer. The first structure may substantially overlie the second structure, or the first structure may substantially underlie the second structure. Alternately, the first structure is substantially coplanar with the second structure.

According to another aspect of the invention there is provided a method of increasing mechanical interlocking between a plurality of layers in an integrated circuit. The plurality of layers is formed with at least a bottom layer and an overlying top layer. An uninterrupted void extending through the top layer and through the bottom layer is formed. The void has a first surface having a first horizontal component within the top layer and a second surface having a second horizontal component within the bottom layer. A first structure is formed within the void, where the first structure has a first mating surface having a first complementary horizontal component and a second mating surface having a second complementary horizontal component.

The first mating surface laterally engages the first surface of the top layer and the first complementary horizontal component is complementary to the first horizontal component of the first surface of the top layer. Similarly, the second mating surface laterally engages the second surface of the bottom layer and the second complementary horizontal component is complementary to the second horizontal component of the second surface of the bottom layer. In this manner the first structure prohibits vertical separation of the plurality of layers.

In various preferred embodiments of this aspect of the invention, the plurality of layers include at least one intervening layer disposed between the bottom layer and the top layer. The plurality of layers may be electrically nonconductive layers where the first structure is an electrically conductive via. Alternately, the top layer and the bottom layer are electrically conductive layers, with at least one electrically nonconductive layer disposed between the top layer and the bottom layer, and the first structure is an electrically conductive via. In yet another embodiment, the top layer and the bottom layer comprise electrically conductive layers, with at least one electrically nonconductive layer disposed between the top layer and the bottom layer, and the first structure is electrically nonconductive. Preferably, a plurality of voids are formed and a plurality of first structures are formed within the voids.

In yet another aspect of the invention, a method is described of increasing mechanical interlocking between a first underlying layer and a second overlying layer in an integrated circuit. The first layer is formed with an upper surface having a series of first surfaces, where each of the first surfaces have an associated first horizontal component. The second layer is formed on top of the first layer, with a lower surface having a series of second mating surfaces, each of the second mating surfaces having an associated second complementary horizontal component. The second mating surfaces of the second layer laterally engage the first surfaces of the first layer, and the second complementary horizontal components of the second surfaces are complementary to the first horizontal components of the first surfaces. In this manner, the engagement between the first surfaces of the first layer and the second mating surfaces of the second layer prohibit vertical separation of the first layer and the second layer.

Preferably, the first surfaces are formed by etching the first layer. Alternately, the first surfaces are formed by forming additional material on the first layer. In one embodiment, the first layer is an electrically conductive layer and the second layer is an electrically nonconductive layer. Alternately, the first layer is an electrically nonconductive layer and the second layer is an electrically conductive layer. Preferably, the first surfaces of the first layer are formed in elongate parallel rows, but may be formed in smaller, discrete portions.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
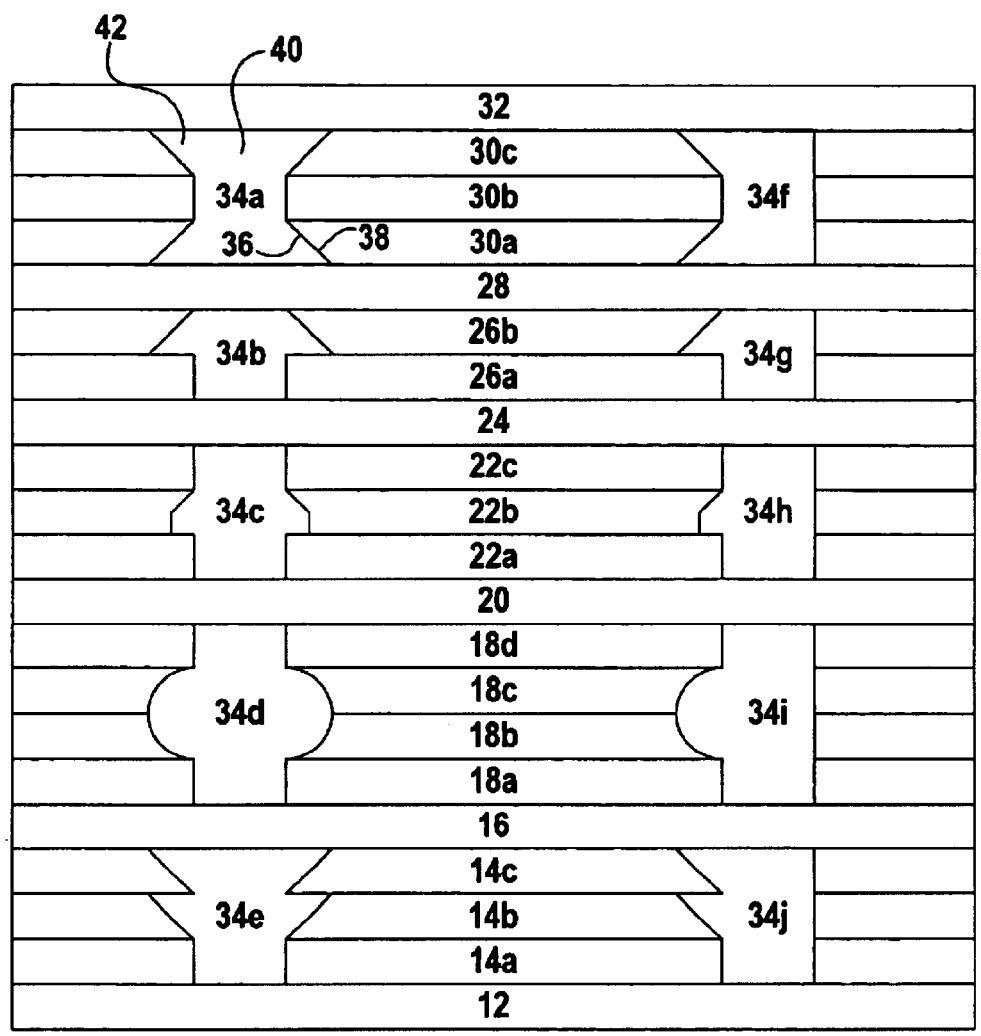
FIG. 1 is a cross sectional view of layers of an integrated circuit, depicting several types of interlocking structures.

With reference now to FIG. 1 there is depicted a cross sectional view of layers 12–28 of an integrated circuit 10, depicting several types of interlocking structures. FIG. 1 generally depicts structures 34a–34e having barbs 42 that are either double sided on the trunk 40, as explained in more detail below, or completely circumferential about the trunk 40. Also depicted are structures 34f–34i having barbs that are on one side of the trunk 40. Structures 34a and 34f depict barbs that extend into both a top layer 30c and a bottom layer 30a, structures 34b and 34g depict barbs 42 that are relatively sharp, structures 34c and 34h depict barbs 42 that are relatively blunted, structures 34d and 34i depict barbs that are relatively rounded, and structures 34e and 34j depict multiple barbs on a trunk 40. Thus, it is appreciated that there are many configurations that are possible, including many not depicted, which are combinations or extrapolations of the designs depicted in FIG. 1 and the other figures.

In one embodiment the structures 34a–34i are electrically conductive structures, such as metal vias, and the layers 12, 16, 20, 24, 28, and 32 are also electrically conductive structures. Layer 32 is in one embodiment a bonding pad. Similarly, layers 14, 18, 22, 26, and 30 are then electrically nonconductive layers, such as silicon oxide. However, the structures and layers depicted herein may be formed of any one or more of a number of different materials that are compatible with the materials, structures, functions, and processing of integrated circuits, and the invention in its broadest embodiment should not limited to any specific combination of such materials. For example, in an alternate embodiment, the structures 34a–34i and the layers 12, 16, 20, 24, 28, and 32 are electrically nonconductive structures, and the layers 14, 18, 22, 26, and 30 are electrically conductive layers.

It is appreciated that the structures as depicted in the figures are representational only, and may not depict actual devices as formed by the various layers so depicted. Rather, the various layers and structures are representative of various different exemplary embodiments of structures according to the present invention, which should not be limited to the specific combinations of structures and layers as depicted.

As can be seen, each of the barbs 42 have at least one surface 36 with a horizontal component. By this it is meant that the surface 36 is not completely vertical. The surface 36 engages with a surface 38 of an adjacent structure, which has a complimentary horizontal component, in that the surfaces 36 and 38 engage and prohibit the relative vertical movement of the adjacent structures. For example, the surfaces 36 and 38 prohibit the relative vertical movement between the structure 34a and the layer 30. Thus, a bonding pad 32, for example, connected to a via 34a, would tend to be retained against vertical forces, such as those imparted by the lifting of a bonding tool.

A structure as described above, such as structure 34a, can be formed in a variety of ways. For example, portions of the structure 34a can be deposited in layers. In one embodiment, a layer corresponding to layer 30a is deposited and etched to form a void where the first portion of the structure 34a is to be formed, which is filled with the material to be used for the structure 34a, to form that first portion of the structure 34a. Then the layer 30b is deposited and etched to form a void where the second portion of the structure 34a is to be formed, which is also filled with material to form the second portion. Finally, the layer 30c is deposited and etched to form a void where the third portion of the structure 34a is to be formed, which is then filled with material to form the third portion of the structure 34a. Thus, the structure 34a and the adjacent interlocking structure need not be formed in a single deposition or etch cycle, but may be built up from multiple layers of materials. When formed in this manner, the structure 34a tends to prohibit vertical forces from causing the layers 30a–30c from delaminating.

Figure 2:
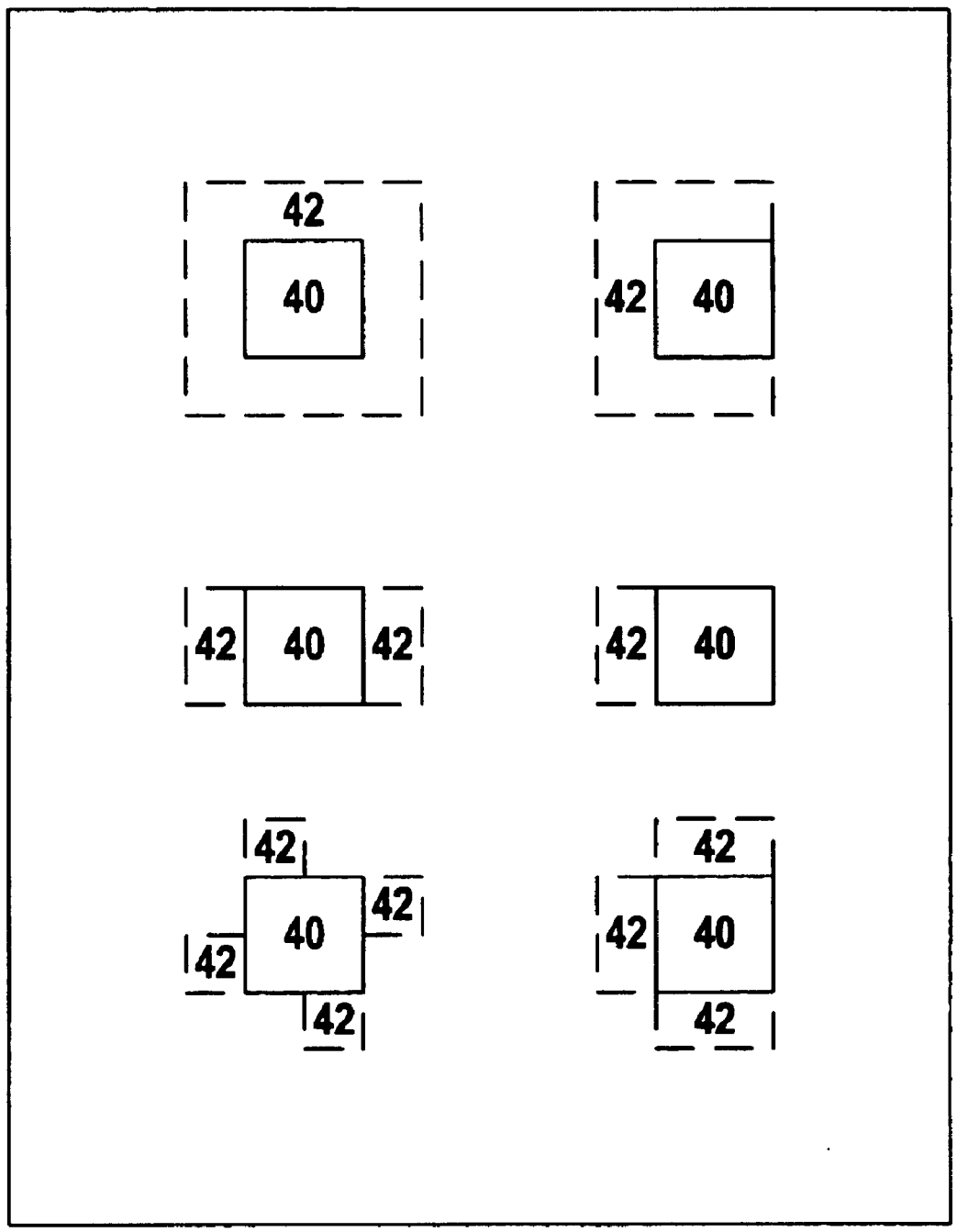
FIG. 2 is a top plan view of an integrated circuit, depicting several types of interlocking structures.

FIG. 2 is a top plan view of an integrated circuit 10, depicting the barbed structures from the top. In this manner, the various configurations of structures are depicted, where the barb or barbs 42 extend completely or partially around the circumference of the trunk 40 of the structures. Those portions of the barbs 42 depicted in phantom indicate that such portions would be below the upper surface of the adjacent layer in which the barbed structures are formed. Thus, it is seen that there are a number of different configurations of barbs 42 around a trunk 40.

Figure 3:
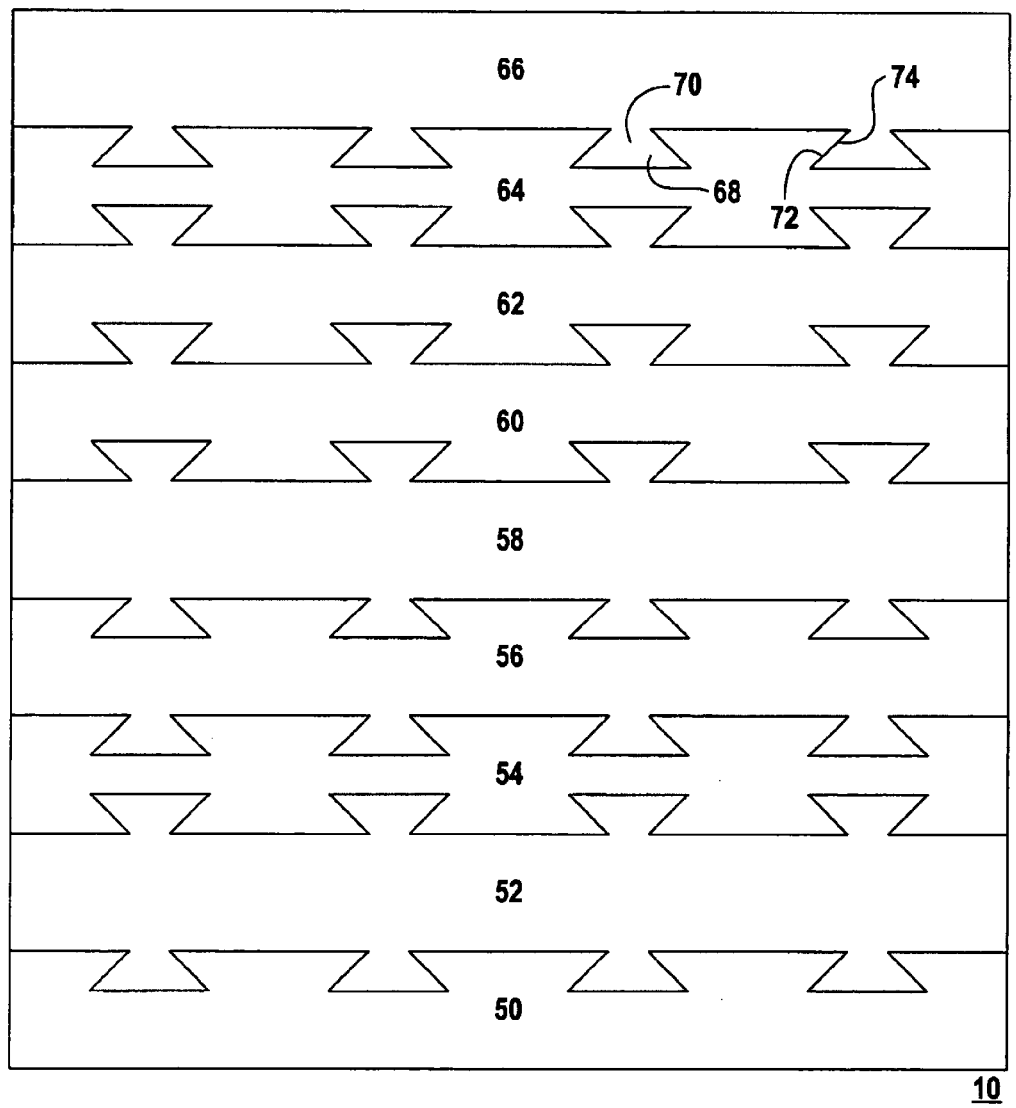
FIG. 3 is a cross sectional view of layers of an integrated circuit, depicting several types of interlocking layers.

With reference now to FIG. 3 there is depicted a cross sectional view of an integrated circuit 10 having a plurality of overlying layers 50–66. These substantially horizontal layers are also mechanically interlocked in a manner according to the present invention, by the formation of voids 68 that are formed like mortise cuts in one layer, and tenons 70 that are formed in an adjacent layer. Similar to that as described above, the voids 68 have surfaces 72 that have a horizontal component, that engage with surfaces 74 of the tenons 70, which have complimentary horizontal components. The engagement of the surfaces 72 and 74 prohibit relative vertical movement between the adjacent layers. It is also appreciated that the engagement of the surfaces 72 and 74 also prohibits relative horizontal movement between the adjacent layers, which may be important and desirable in some applications.

The voids 68 may be formed such as by etching the top surface of a layer 50 after it is deposited, or by depositing or otherwise forming additional material on the top surface of the layer 50 in those portions adjacent the voids 68. For example, the top surface of the layer 50 is masked in one embodiment to expose portions of the top surface where the voids 68 are to be formed. The exposed portions are then etched to form the voids 68. Thus, an isotropic etch can be performed, such as a wet etch, or an etch that follows along specific crystallographic planes can be performed. Alternately, the surface of the layer 50 can be masked in the areas where the voids are to be formed, and additional material can be selectively grown on the top surface of the layer 50. When the masking material is subsequently removed, the voids 68 are then present where the masking material once resided.

Figure 4:
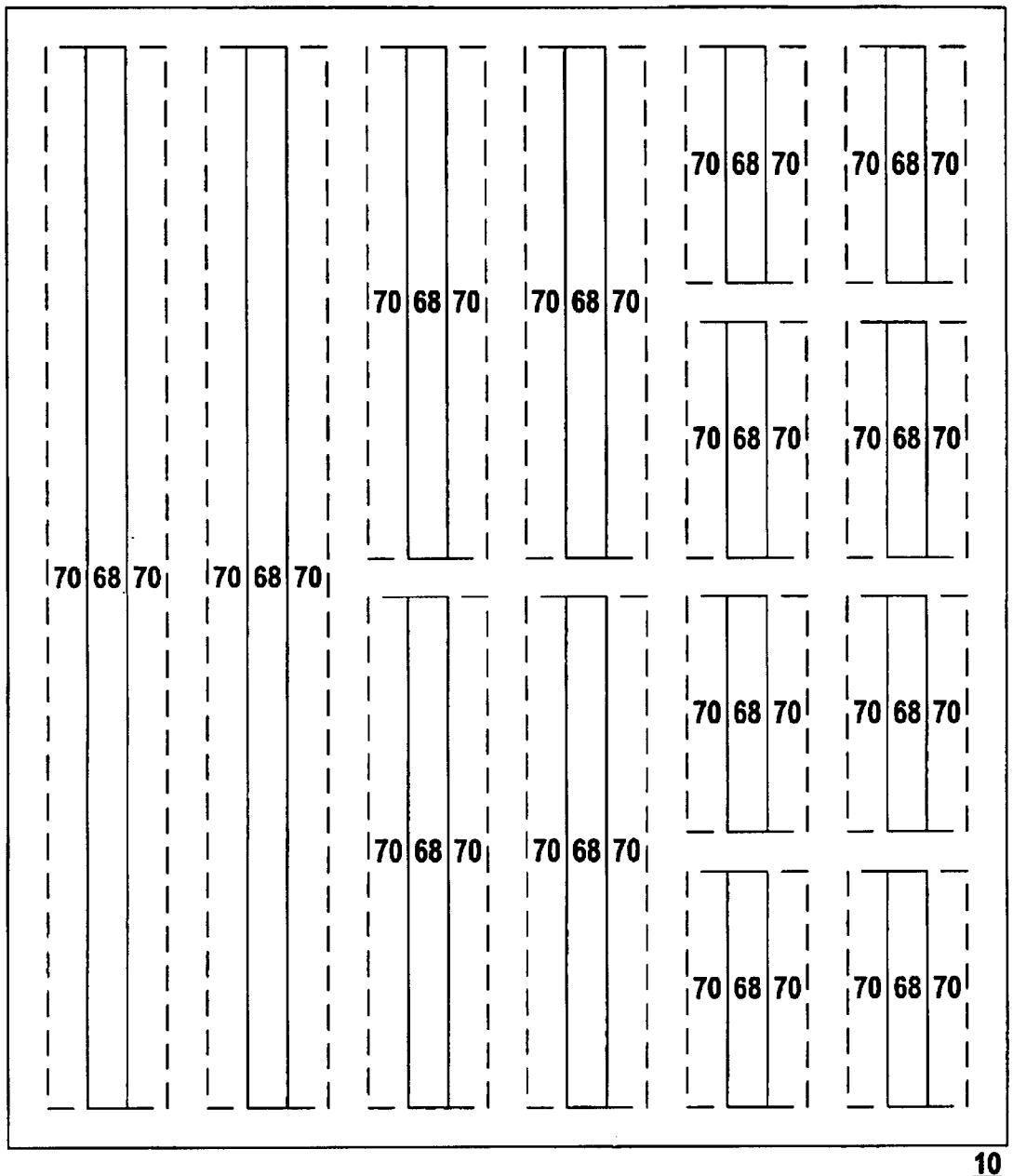
FIG. 4 is a top plan view of an integrated circuit, depicting several types of interlocking layers.

With reference now to FIG. 4 there is depicted a top plan view of an integrated circuit 10, showing a representational top view of some of the interlocking structures. As depicted, the interlocking portions 68 and 70 may be formed in elongate parallel rows, or in smaller, discrete portions.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of increasing mechanical interlocking between a first structure and a second adjacent structure in an integrated circuit, the method comprising the steps of:
   forming the first structure with a first surface having a first horizontal component, and
   forming the second structure with a second surface having a second horizontal component, where the first surface laterally engages the second surface and the first horizontal component is complementary to the second horizontal component, such that the first structure prohibits vertical movement of the second structure,
   wherein the first surface includes multiple sharp barbs, and the first horizontal component extends substantially linearly and at a substantially constant angle from an upper surface of the second structure to a lower surface of the second structure.

2. The method of claim 1, wherein the first structure is an electrically conductive via and the second structure is an electrically nonconductive layer through which the via passes.

3. The method of claim 1, wherein the second structure is an electrically conductive via and the first structure is an electrically nonconductive layer through which the via passes.

4. The method of claim 1, wherein the first structure is an electrically conductive layer and the second structure is an electrically nonconductive layer.

5. The method of claim 1, wherein the second structure is an electrically conductive layer and the first structure is an electrically nonconductive layer.

6. The method of claim 1, wherein the first structure substantially overlies the second structure.

7. The method of claim 1, wherein the first structure substantially underlies the second structure.

8. The method of claim 1, wherein the first structure is substantially coplanar with the second structure.

9. An integrated circuit formed according to the method of claim 1.

10. A method of increasing mechanical interlocking between a plurality of layers in an integrated circuit, the method comprising the steps of:
    forming the plurality of layers with at least a bottom layer and an overlying top layer,
    forming an uninterrupted void extending through the top layer and through the bottom layer, where the void has a first surface having a first horizontal component within the top layer and a second surface having a second horizontal component within the bottom layer,
    forming a first structure within the void, where the first structure has a first mating surface having a first complementary horizontal component and a second mating surface having a second complementary horizontal component, where the first mating surface laterally engages the first surface of the top layer and the first complementary horizontal component is complementary to the first horizontal component of the first surface of the top layer, and the second mating surface laterally engages the second surface of the bottom layer and the second complementary horizontal component is complementary to the second horizontal component of the second surface of the bottom layer, such that the first structure prohibits vertical separation of the plurality of layers,
    where the first and second surfaces include sharp barbs, one each of the barbs in each of the plurality of layers and each barb extends substantially linearly and at a substantially constant angle from an upper surface of each of the plurality of layers to a lower surface of each of the plurality of layers.

11. The method of claim 10, wherein the plurality of layers further comprises at least one intervening layer disposed between the bottom layer and the top layer.

12. The method of claim 10, wherein the plurality of layers comprise electrically nonconductive layers and the first structure comprises an electrically conductive via.

13. The method of claim 10, wherein the top layer and the bottom layer comprise electrically conductive layers, at least one electrically nonconductive layer is disposed between the top layer and the bottom layer, and the first structure is an electrically conductive via.

14. An integrated circuit formed according to the method of claim 10.

15. A method of increasing mechanical interlocking between a first underlying layer and a second overlying layer in an integrated circuit, the method comprising the steps of:
    forming the first layer with an upper surface having a series of elongate first surfaces, each of the first surfaces having an associated first horizontal component,
    forming the second layer on top of the first layer, with a lower surface having a series of second mating surfaces, each of the second mating surfaces having an associated second complementary horizontal component, where the second mating surfaces of the second layer laterally engage the first surfaces of the first layer and the second complementary horizontal components of the second surfaces are complementary to the first horizontal components of the first surfaces, such that the engagement between the first surfaces of the first layer and the second mating surfaces of the second layer prohibit vertical separation of the first layer and the second layer, where the first surfaces each include a sharp barb, and each barb extends substantially linearly and at a substantially constant angle from the lower surface of the second layer but does not extend to an upper surface of the second layer.

16. The method of claim 15, wherein the first surfaces are formed by etching the first layer.

17. The method of claim 15, wherein the first surfaces are formed by forming additional material on the first layer.

18. The method of claim 15, wherein the first layer is an electrically conductive layer and the second layer is an electrically nonconductive layer.

19. The method of claim 15, wherein the first layer is an electrically nonconductive layer and the second layer is an electrically conductive layer.

20. An integrated circuit formed according to the method of claim 15.

* * * * *